United States Patent
Blanc

(10) Patent No.: US 11,412,608 B2
(45) Date of Patent: Aug. 9, 2022

(54) FLEXIBLE PRINTED CIRCUIT BOARD

(71) Applicant: Nortech Systems, Inc., Maple Grove, MN (US)

(72) Inventor: Scott G. Blanc, Bemidji, MN (US)

(73) Assignee: Nortech Systems, Inc., Maple Grove, MN (US)

( * ) Notice: Subject to any disclaimer, the term of this patent is extended or adjusted under 35 U.S.C. 154(b) by 0 days.

(21) Appl. No.: 16/961,406

(22) PCT Filed: Jan. 11, 2019

(86) PCT No.: PCT/US2019/013337
§ 371 (c)(1),
(2) Date: Jul. 10, 2020

(87) PCT Pub. No.: WO2019/140290
PCT Pub. Date: Jul. 18, 2019

(65) Prior Publication Data
US 2020/0383202 A1 Dec. 3, 2020

Related U.S. Application Data

(60) Provisional application No. 62/616,821, filed on Jan. 12, 2018.

(51) Int. Cl.
*H05K 1/02* (2006.01)
*H05K 1/11* (2006.01)

(52) U.S. Cl.
CPC ........... *H05K 1/0221* (2013.01); *H05K 1/118* (2013.01)

(58) Field of Classification Search
CPC ..... H05K 1/118; H05K 1/0219; H05K 1/0221
See application file for complete search history.

(56) References Cited

U.S. PATENT DOCUMENTS

2008/0236868 A1 10/2008 Koga
2009/0213565 A1* 8/2009 Booth, Jr. ............ H05K 1/0218
361/818

(Continued)

FOREIGN PATENT DOCUMENTS

JP 2006024618 A * 1/2006 ............... H05K 1/02
WO 2017052048 A1 3/2017

OTHER PUBLICATIONS

International Search Report dated May 23, 2019 for International Patent Application No. PCT/US2019/013337, 4 pages.

(Continued)

*Primary Examiner* — Paresh Paghadal
(74) *Attorney, Agent, or Firm* — Morgan, Lewis & Bockius LLP

(57) ABSTRACT

A flexible printed circuit board comprises a conducting layer that includes a first signal line, a first ground plane and a second ground plane. A first shielding via extends from a third ground plane to a fourth ground plane and extends through the first ground plane to electrically connect the first ground plane, the third ground plane and the fourth ground plane. A second shielding via extends from the third ground plane to the fourth ground plane. The first ground plane, the second ground plane, the third ground plane, the fourth ground plane, the first shielding via and the second shielding via, together, circumferentially surround the first signal line to minimize electromagnetic interference with the first signal line.

29 Claims, 7 Drawing Sheets

(56) References Cited

U.S. PATENT DOCUMENTS

| | | | |
|---|---|---|---|
| 2010/0182105 A1* | 7/2010 | Hein | H05K 1/0219 |
| | | | 333/239 |
| 2013/0322029 A1* | 12/2013 | Hurwitz | H05K 9/0024 |
| | | | 361/748 |
| 2014/0085856 A1 | 3/2014 | Shirao et al. | |
| 2016/0020500 A1 | 1/2016 | Matsuda | |
| 2016/0366765 A1 | 12/2016 | Martinez et al. | |
| 2018/0146542 A1* | 5/2018 | Fukuchi | H05K 1/181 |
| 2019/0045630 A1* | 2/2019 | Kim | H05K 1/189 |
| 2019/0088388 A1* | 3/2019 | Baba | H01P 3/08 |
| 2019/0296414 A1* | 9/2019 | Xu | H05K 1/0298 |
| 2019/0306993 A1* | 10/2019 | Kim | B32B 5/24 |

OTHER PUBLICATIONS

Written Opinion dated May 23, 2019 for International Patent Application No. PCT/US2019/013337, 6 pages.

* cited by examiner

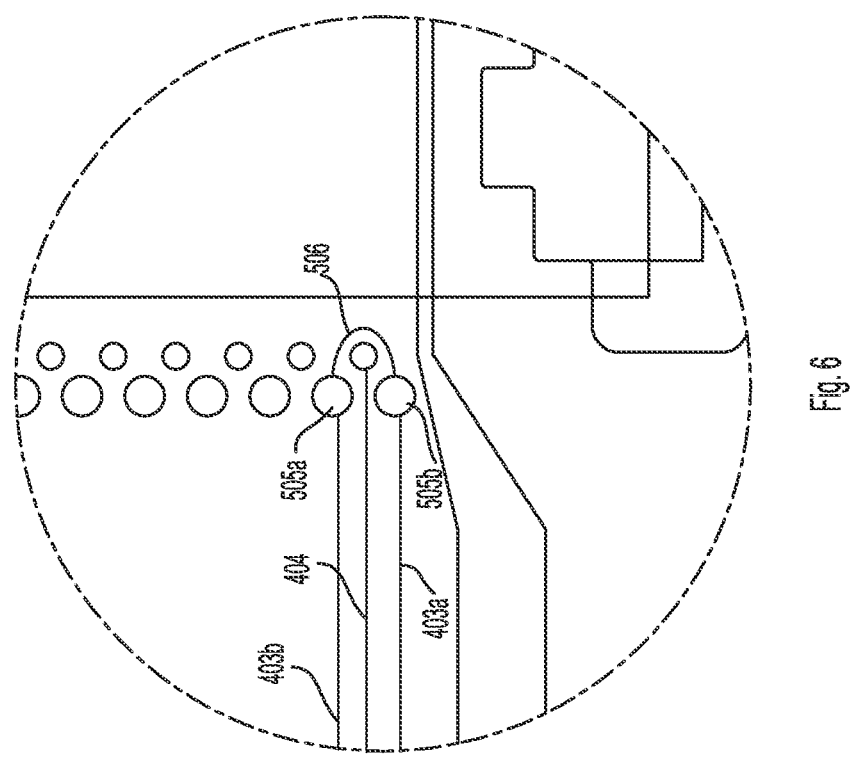

FLEXIBLE PRINTED CIRCUIT BOARD

CROSS-REFERENCE TO RELATED APPLICATIONS

This application is a national stage of International Application No. PCT/US2019/013337 filed on Jan. 11, 2019, which claims priority to U.S. Provisional Patent Application No. 62/616,821 filed Jan. 12, 2018 entitled "Flexible Printed Circuit Board", each of which is incorporated by reference herein in its entirety.

FIELD OF THE INVENTION

The present invention generally relates to flexible printed circuit board and, more particularly, to a flexible printed circuit board for transmitting high frequency signals.

BRIEF SUMMARY OF THE INVENTION

A flexible printed circuit board is disclosed that comprises a conducting layer including a first signal line, a first ground plane and a second ground plane; a first ground plane layer including a third ground plane; a second ground plane layer including a fourth ground plane; and a first shielding via extending from the third ground plane to the fourth ground plane and extending through the first ground plane to electrically connect the first ground plane, the third ground plane and the fourth ground plane; and a second shielding via extending from the third ground plane to the fourth ground plane and extending through the second ground plane to electrically connect the second ground plane, the third ground plane and the fourth ground plane, the first ground plane, the second ground plane, the third ground plane, the fourth ground plane, the first shielding via and the second shielding via, together, circumferentially surrounding the first signal line to minimize electromagnetic interference with the first signal line.

In one aspect, the signal line is positioned between the first ground plane and the second ground plane.

In one aspect, the first signal line is positioned between the third ground plane and the fourth ground plane.

In one aspect, the first signal line is positioned between the first shielding via and the second shielding via.

In one aspect, the impedance of the first signal line is between 45 ohms and 55 ohms.

In one aspect, the impedance of the first signal line is between approximately 49 ohms and approximately 51 ohms.

In one aspect, the impedance of the first signal line is between 67.5 ohms and 82.5 ohms.

In one aspect, the impedance of the first signal line is approximately 75 ohms.

In one aspect, the impedance of the first signal line is between 90 ohms and 110 ohms.

In one aspect, the impedance of the first signal line is approximately 100 ohms.

In one aspect, the flexible printed circuit board comprises a first dielectric plane positioned between the first signal line and the third ground plane.

In one aspect, the first dielectric plane has a thickness of about 0.004 inches.

In one aspect, the flexible printed circuit board comprises a second dielectric plane positioned between the first signal line and the fourth ground plane.

In one aspect, the second dielectric plane has a thickness of about 0.003 inches.

In one aspect, a total thickness of the conducting layer, the first ground plane layer, the second ground plane layer, the first dielectric plane and the second dielectric plane is approximately 0.0094 inches.

In one aspect, the first ground plane, the second ground plane and the first signal line have a thickness of about 0.001 inches.

In one aspect, the third ground plane has a thickness of about 0.007 inches.

In one aspect, the fourth ground plane has a thickness of about 0.007 inches.

In one aspect, the flexible printed circuit board comprises a second signal line, a fifth ground plane and a sixth ground plane at the conducting layer, the second signal line being separate and distinct from the first signal line; a seventh ground plane at the first ground plane layer; an eighth ground plane at the second ground plane layer; a third shielding via extending from the seventh ground plane to the eighth ground plane and extending through the fifth ground plane to electrically connect the fifth ground plane, the seventh ground plane and the eighth ground plane; and a fourth shielding via extending from the seventh ground plane to the eighth ground plane and extending through the sixth ground plane to electrically connect the sixth ground plane, the seventh ground plane and the eighth ground plane, the fifth ground plane, the sixth ground plane, the seventh ground plane, the eighth ground plane, the second shielding via and the third shielding via, together, circumferentially surrounding the second signal line to minimize electromagnetic interference with the second signal line.

In one aspect, the second shielding via and the third shielding via are positioned between the first signal line and the second signal line.

In one aspect, the second ground plane and the fifth ground plane are positioned between the first signal line and the second signal line.

In one aspect, the flexible printed circuit board comprises a dielectric plane positioned between the third ground plane and the seventh ground plane at the first ground plane layer to electromagnetically isolate the third ground plane and the seventh ground plane.

In one aspect, the flexible printed circuit board comprises a dielectric plane positioned between the second ground plane and the fifth ground plane at the conducting layer to electromagnetically isolate the second ground plane and the fifth ground plane.

In one aspect, the flexible printed circuit board comprises a dielectric plane positioned between the fourth ground plane and the eighth ground plane at the second ground plane layer to electromagnetically isolate the fourth ground plane and the eighth ground plane.

A method is disclosed for manufacturing a flexible printed circuit board, the method comprises providing a conducting layer including a first signal line, a first ground plane and a second ground plane; providing a first ground plane layer including a third ground plane; providing a second ground plane layer including a fourth ground plane; and stitching a first shielding via extending from the third ground plane to the fourth ground plane and extending through the first ground plane to electrically connect the first ground plane, the third ground plane and the fourth ground plane; and stitching a second shielding via extending from the third ground plane to the fourth ground plane and extending through the second ground plane to electrically connect the second ground plane, the third ground plane and the fourth ground plane, the first ground plane, the second ground plane, the third ground plane, the fourth ground plane, the first shielding via and the second shielding via, together, circumferentially surrounding the first signal line to minimize electromagnetic interference with the first signal line.

In one aspect, the method further comprises positioning the first signal line between the first ground plane and the second ground plane.

In one aspect, the method further comprises positioning the first signal line between the third ground plane and the fourth ground plane.

In one aspect, the method further comprises providing the first signal line between the first shielding via and the second shielding via.

In one aspect, the impedance of the first signal line is between 47.5 ohms and 52.5 ohms.

In one aspect, the impedance of the first signal line is between approximately 49 ohms and approximately 51 ohms.

In one aspect, the impedance of the first signal line is between 67.5 ohms and 82.5 ohms.

In one aspect, the impedance of the first signal line is approximately 75 ohms.

In one aspect, the impedance of the first signal line is between 90 ohms and 110 ohms.

In one aspect, the impedance of the first signal line is approximately 100 ohms.

In one aspect, the method further comprises providing a first dielectric plane between the first signal line and the third ground plane.

In one aspect, the first dielectric plane has a thickness of about 0.004 inches.

In one aspect, the method further comprises providing a second dielectric plane positioned between the first signal line and the fourth ground plane.

In one aspect, the second dielectric plane has a thickness of about 0.003 inches.

In one aspect, a total thickness of the conducting layer, the first ground plane layer, the second ground plane layer, the first dielectric plane and the second dielectric plane is approximately 0.0094 inches.

In one aspect, the first ground plane, the second ground plane and the first signal line have a thickness of about 0.001 inches.

In one aspect, the third ground plane has a thickness of about 0.007 inches.

In one aspect, the fourth ground plane has a thickness of about 0.007 inches.

In one aspect, the method further comprises providing a second signal line, a fifth ground plane and a sixth ground plane at the conducting layer, the second signal line being separate and distinct from the first signal line; providing a seventh ground plane at the first ground plane layer; providing an eighth ground plane at the second ground plane layer; stitching a third shielding via extending from the seventh ground plane to the eighth ground plane and extending through the fifth ground plane to electrically connect the fifth ground plane, the seventh ground plane and the eighth ground plane; and stitching a fourth shielding via extending from the seventh ground plane to the eighth ground plane and extending through the sixth ground plane to electrically connect the sixth ground plane, the seventh ground plane and the eighth ground plane, the fifth ground plane, the sixth ground plane, the seventh ground plane, the eighth ground plane, the second shielding via and the third shielding via, together, circumferentially surrounding the second signal line to minimize electromagnetic interference with the second signal line.

In one aspect, the method further comprises positioning the second shielding via and the third shielding via between the first signal line and the second signal line.

In one aspect, the method further comprises positioning the second ground plane and the fifth ground plane between the first signal line and the second signal line.

In one aspect, the method further comprises positioning a dielectric plane between the third ground plane and the seventh ground plane at the first ground plane layer to electromagnetically isolate the third ground plane and the seventh ground plane.

In one aspect, the method further comprises positioning a dielectric plane between the second ground plane and the fifth ground plane at the conducting layer to electromagnetically isolate the second ground plane and the fifth ground plane.

In one aspect, the method further comprises positioning a dielectric plane between the fourth ground plane and the eighth ground plane at the second ground plane layer to electromagnetically isolate the fourth ground plane and the eighth ground plane.

BRIEF DESCRIPTION OF THE SEVERAL VIEWS OF THE DRAWINGS

The foregoing summary, as well as the following detailed description of embodiments of the invention, will be better understood when read in conjunction with the appended drawings of an exemplary embodiment. It should be understood, however, that the invention is not limited to the precise arrangements and instrumentalities shown.

In the drawings:

FIG. 6 is a magnified view 6-6 of a portion of FIG. 5.

DETAILED DESCRIPTION OF THE EXEMPLARY EMBODIMENTS OF THE INVENTION

Figure 1:
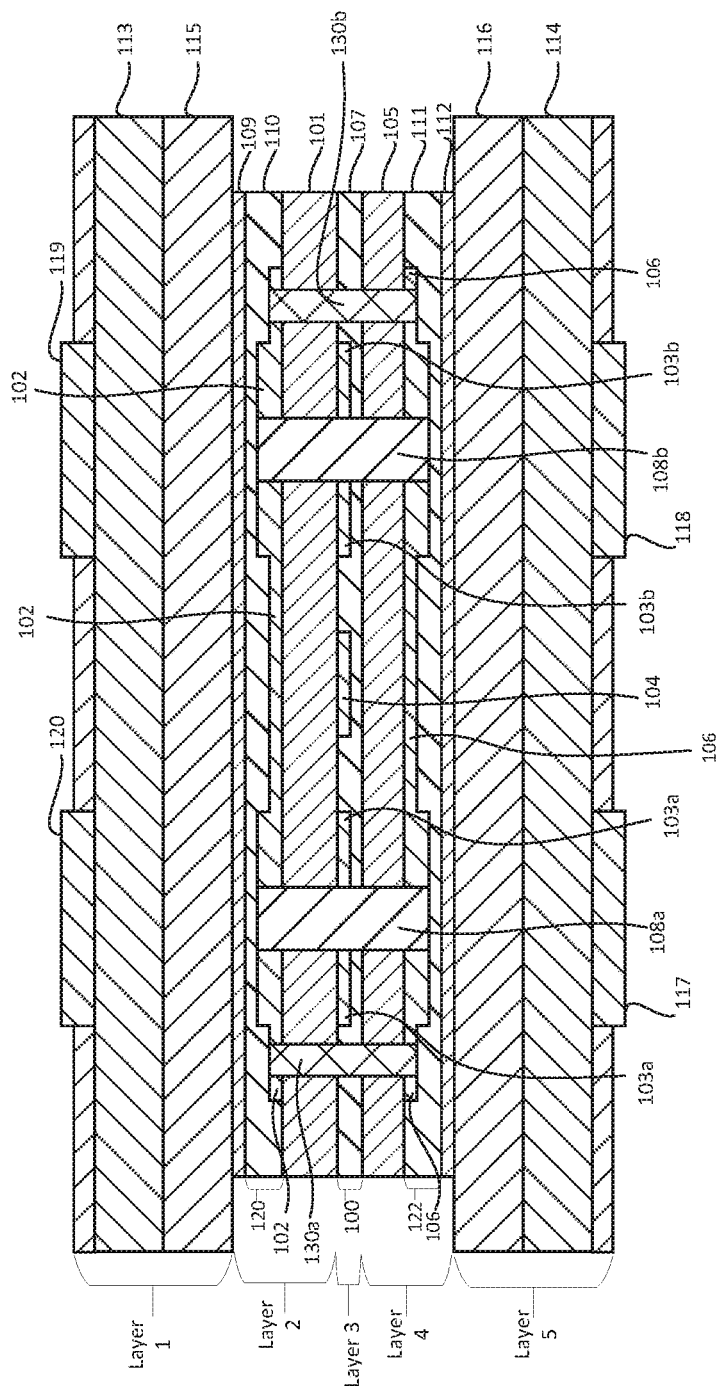
FIG. 1 is a partial cross-section of a flexible printed circuit board, according to an exemplary embodiment of the invention.

In high frequency applications requiring a number of different radio frequency (RF) signals, such as radio or video transmission systems, coaxial cables may be used as the signal lines. There are a number of advantages to using coaxial cables. For instance, coaxial cables may be used to minimize electromagnetic interference (i.e., crosstalk) between signal lines. However, to achieve these desired effects, the coaxial cables may be bulky, making them unsuitable for applications requiring compact signal lines.

A flexible printed circuit board (FPCB) may be preferred over coaxial cable because the FPCB is more compact. An FPCB is a combination of different substrates laminated together to form an electrical circuit. However, to use an FPCB and maintain a compact design, the signal lines must be placed in close proximity to one another. Unfortunately, when the signal lines on an FPCB are placed in close proximity to one another, there may be electromagnetic interference between the signal lines that causes signal degradation. As such, there exists a need to have a compact signal line configuration that also minimizes electromagnetic interference. Tolerances may be easier to control when printing, or performing photolithography.

In one embodiment of the invention, an FPCB having multiple signal lines includes one or more ground planes positioned around each signal line on the same and/or different layers of the FPCB. The ground planes may be electrically connected by stitching vias. Once the ground planes are electrically connected, an electromagnetic shield (or Faraday cage) that circumferentially surrounds the signal line may be formed to protect the signal line from electromagnetic interference from external sources.

Referring to the drawings in detail, wherein like reference numerals indicate like elements throughout, there is shown in FIGS. 1-6, respectively, a flexible printed circuit board (FPCB) 10, and FPCB 20, a method 30 for manufacturing a FPCB, a FPCB 40 and a cable 50, in accordance with exemplary embodiments of the present invention.

FIG. 1 shows a cross-section of a FPCB 10, according to an exemplary embodiment of the invention. The FPCB 10 may include a conductive layer 100. The conductive layer 100 may include signal line 104, side ground plane 103a and/or side ground plane 103b.

The signal line 104 may be configured to transmit an electrical signal (e.g., an RF signal or a video signal). In some embodiments, the electrical signal may exceed 100 MHz. At these frequencies, the electrical signal may experience attenuation and reduction in signal quality as a result of exposure to any electromagnetic interference. The electromagnetic interference may have a greater effect at higher frequency signals as compared to lower frequency signals. As used herein, attenuation may refer to any reduction in the strength of a signal. The effects of attenuation and reduction in signal quality may be mitigated by utilizing a FPCB with select materials used for each layer, and traces having tighter variances, such as trace width, trace height and trace spacing as compared to co-axial cable.

Side ground plane 103a and side ground plane 103b may be positioned on opposite sides of the signal line 104. Side ground plane 103a and/or side ground plane 103b may be configured as an electro-magnetic shield to electrically isolate signal line 104 from external sources (e.g., other signal lines).

The signal line, side ground plane 103a and/or side ground plane 103b may each be approximately 0.001 inches thick.

The FPCB 10 may include top ground plane 102 and/or bottom ground plane 106. The top ground plane 102 and/or bottom ground plane 106 may be configured as an electromagnetic shield to electrically isolate the signal line 104 from external sources. Top ground plane 102 and/or bottom ground plane 106 may be flexible with a bend radius as tight as 0.5 inches. Top ground plane 102 and/or bottom ground plane 106 may be 0.5 oz. copper. Top ground plane 102 and/or bottom ground plane 106 may be 1.0 oz. copper.

Side ground plane 103a, side ground plane 103b and signal line 104 may be positioned between top ground plane 102 and bottom ground plane 106.

The FPCB 10 may include dielectric layer 101 and dielectric layer 105. Dielectric layer 101 and dielectric layer 105 may be configured to electrically insulate signal line 104 from ground planes 102, 103a, 103b, 106 to prevent short circuiting of the signal line 104. Dielectric layer 101 and/or dielectric layer 105 may be an adhesive. Dielectric layer 101 and/or dielectric layer 105 may be a flexible laminate. Dielectric layer 101 may be approximately 0.004 inches thick. Dielectric layer 105 may be approximately 0.003 inches thick. The signal line 104 may be positioned between dielectric layer 101 and dielectric layer 105.

The signal line 104, dielectric layer 101 and dielectric layer 105 may be connected using an acrylic adhesive 107. The acrylic adhesive 107 may be positioned between the signal line 104 and the side ground planes 103a and 103b configured to electrically insulate signal line 104 from the side ground planes 103a and 103b. Via may be a shielding via or stitching via that extends between two or more layers and connects two or more layers and may be used for shielding from electromagnetic interference or connecting ground planes as discussed in further detail below. In some embodiments, vias are formed after layers are formed (e.g., by drilling holes). In some embodiments, a cross-section of a via is circular, but in other embodiments the cross-section of a via may be square or triangular.

The FPCB 10 may include shielding via 108a and shielding via 108b. Shielding via 108a and/or shielding via 108b may each be a segment of conductive material that extends between two parallel layers to electrically couple the layers together. Shielding via 108a and/or shielding via 108b may have a cross-sectional diameter of less than or equal to 0.100 inches, and in some embodiments 0.0078 inches. Shielding via 108a and/or shielding via 108b may have a cross-sectional diameter of less than 50% of the width of the narrowest layer that the via passes through. In some embodiments, shielding via 108a and/or shielding via 108b may have a cross-sectional diameter between 0.100 inches and 0.050 inches. In some embodiments, the shielding via 108a may have a different cross-sectional diameter than the shielding via 108b. Shielding via 108a and/or shielding via 108b may be generally perpendicular to the two parallel layers that vias 108a-b connect. Shielding via 108a and/or shielding via 108b may be inserted into the FPCB 10 after the layers are formed as discussed in further detail below. For example, shielding via 108a and/or shielding via 108b may be stripline stitched into FPCB 10.

The FPCB 10 may include stitching via 130a and/or stitching via 130b that may connect two or more ground systems to create a common ground between the two ground systems and thereby reduce phase variance between two or more signal lines and/or prevent either of the ground systems from acting as a transmission line segment themselves. Stitching via 130a and/or stitching via 130b may be a segment of conductive material that extends between two parallel ground layers to electrically couple the ground layers together. Stitching via 130a and/or stitching via 130b may have a diameter of 0.100 inches, and in some embodiments 0.0078 inches. Stitching via 130a and/or stitching via 130b may be generally perpendicular to the two ground layers. Stitching via 130a and/or stitching via 130b may be inserted into the FPCB 10 after the layers are formed as discussed in further detail below. For example, stitching vias 130a-b may be stripline stitched into FPCB 10.

In some embodiments, the FPCB 10 may not include any shielding vias and stitching vias. In some embodiments, the FPCB 10 may include only shielding vias. In some embodiments, the FPCB 10 may include only stitching vias.

Shielding via 108a may be configured to electrically connect top ground plane 102, side ground plane 103a and bottom ground plane 106 to surround at least a portion of the signal line 104. Shielding via 108b may electrically connect top ground plane 102, side ground plane 103b and bottom ground plane 106. Shielding via 108a and/or shielding via 108b may be flexible. Shielding via 108a, shielding via 108b, side ground plane 103a, side ground plane 103b, top ground plane 102, and/or bottom ground plane 106 may circumferentially surround signal line 104 to minimize electromagnetic interference (e.g., cross-talk) between the signal line 104 and external sources.

The FPCB 10 may include top interior cover layer 110 and bottom interior cover layer 111. Top interior cover layer 110 and/or bottom interior cover layer 111 may be configured to cover top ground plane 102, bottom ground plane 106 and shielding vias 108a, 108b. Top interior cover layer 110 and/or bottom interior cover layer 111 may be an acrylic adhesive. Top interior cover layer 110 and/or bottom interior cover layer 111 may be 0.001 inches thick. The FPCB 10 may include top exterior cover layer 109 and bottom exterior cover layer 112. Top exterior cover layer 109 may be configured to cover top interior cover layer 110. Bottom exterior cover layer 112 may be configured to cover bottom interior cover layer 111. Top exterior cover layer 109 and/or bottom exterior cover layer 112 may be a polyimide film (e.g., a KAPTON film). Top exterior cover layer 109 and/or bottom exterior cover layer 112 may be 0.001 inches thick.

The FPCB 10 may include top prepreg layer 115 and bottom prepreg layer 116. The basic material that may be needed to build a multi-layer board may include copper foil, prepreg (preimpregnated bonding sheet) and inner-layer cores. In some embodiments, a prepreg is a fibrous material preimpregnated with a particular synthetic resin, which may be used in making reinforced plastics. Top prepreg layer 115 and/or bottom prepreg layer 116 may be 0.005 inches thick. Top prepreg layer 115 may contact top cover layer 109. Bottom prepreg layer 116 may contact bottom cover layer 112. The FPCB 10 may include top laminate layer 113 and bottom laminate layer 114. The top laminate layer 113 and bottom laminate layer 114 may include a high performance FR406.008 0/H epoxy material. Top laminate layer 113 and/or bottom laminate layer 114 may be 0.008 inches thick. Top laminate layer 113 may contact top prepreg layer 115. Bottom laminate layer 114 may contact bottom prepreg layer 116. The FPCB 10 may include through vias 117, 118, 119 and 120. Through vias 117, 118, 119 and 120 may include pads in corresponding positions on different layer of the FPCB 10 that may provide electrical connectivity between elements.

Figure 2:
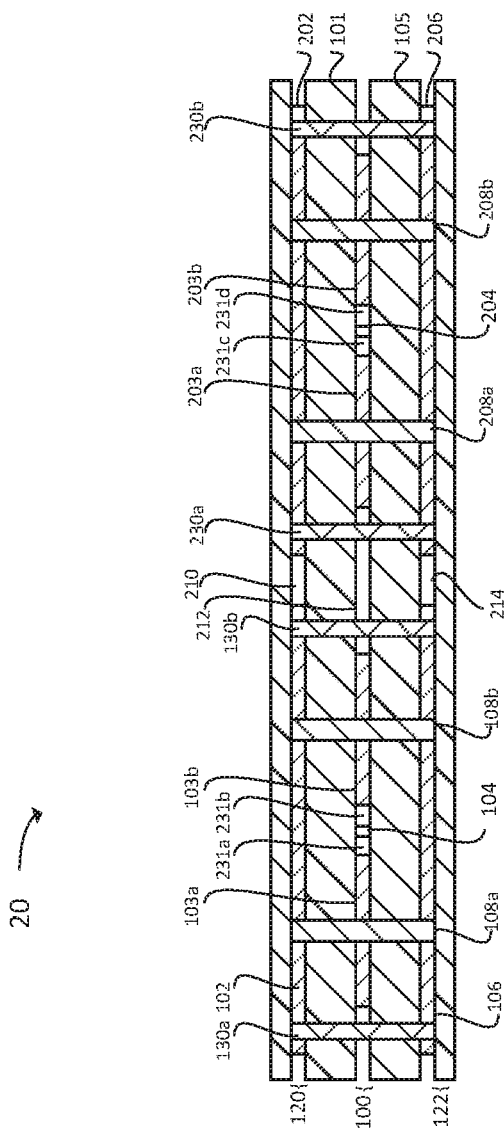
FIG. 2 is a partial cross-section of a flexible printed circuit board, according to an exemplary embodiment of the invention.

FIG. 2 shows a cross-section of an exemplary FPCB 20, according to one embodiment of the invention. The FPCB 20 shown in FIG. 2 is similar to the FPCB 10 shown in FIG. 1, but also includes an additional signal line and corresponding structure as described below in more detail.

FPCB 20 may include a signal line 204, separate and distinct from signal line 104. The signal line 204 may be configured to transmit an electrical signal (e.g., an RF signal or a video signal). In some embodiments, the electrical signal may exceed 100 MHz. In some embodiments of the invention, an FPCB 20 may include 4, 8, 16, 32, 64, and/or N signal lines, where N is an integer.

FPCB 20 may include side ground plane 203a, side ground plane 203b, top ground plane 202 and bottom ground plane 206. Side ground plane 203a, side ground plane 203b, top ground plane 202 and/or bottom ground plane 206 may include similar features as side ground plane 103a, side ground plane 103b, top ground plane 102 and bottom ground plane 106, respectively.

In some embodiments, signal line 104 is electrically separated from signal line 204 by an inter-channel gap. In some embodiments, a dielectric layer 210 may be positioned between top ground plane 102 and top ground plane 202. In some embodiments, a dielectric layer 212 may be positioned between side ground plane 103b and side ground plane 203a. In some embodiments, a dielectric layer 214 may be positioned between bottom ground plane 106 and bottom ground plane 206. In some embodiments, signal line 104 may be positioned between a dielectric layers 231a-b. In some embodiments, signal line 204 may be positioned between a dielectric layers 231c-d.

FPCB 20 may include shielding via 208a and/or shielding via 208b. Shielding via 208a and/or shielding via 208b may include similar features as shielding via 108a and/or shielding via 108b of FIG. 1, respectively. Side ground plane 203a, side ground plane 203b, top ground plane 202, bottom ground plane 206, shielding via 208a and shielding via 208b may be configured to minimize electromagnetic interference between signal line 204 and external sources (e.g., signal line 104).

FPCB 20 may include stitching via 230a and/or stitching via 230b that may connect two or more ground systems to create a common ground between the two ground systems and thereby reduce phase variance between two or more signal lines and/or prevent either of the ground systems from acting as a transmission line segment themselves. Stitching via 230a and/or stitching via 130b may include similar features as stitching via 130a and/or stitching via 130b of FIG. 1, respectively.

In some embodiments, FPCB 20 includes a plurality of vias, including shielding vias 208a-b and stitching vias 230a-b, spaced, and in some embodiments staggered, along an axial direction of the FPCB 20 on both sides of the signal line 104. A distance between each via along the axial direction may be based on, or a function of, a frequency of the electrical signal propagating through signal line 204. In some embodiments, the distance between each via along the axial direction may be inversely proportional to the frequency of the electrical signal, such that, as the frequency of the electrical signal increases, the distance between each via along the axial direction may decrease.

In some embodiments, a rigid-flex printed circuit board may include FPCB 20. The rigid-flex printed circuit board may include rigid ends. The rigid ends may include one or more plugs. FPCB 20 may be positioned in between the rigid ends of the rigid-flex printed circuit board.

In some embodiments, the FPCB 20 is configured to meet one or more design standards. Examples of design standards may include IPC-2221B, IPC-2223, IPC-4101E, IPC-4204B and IPC6013D, all of which are incorporated herein in their entireties.

IPC-2221B: Is the foundation design standard for all documents in the IPC-2220 series. This standard establishes the generic requirements for the design of printed boards and other forms of component mounting or interconnecting structures, whether single-sided, double-sided or multilayer.

IPC-2223: Establishes the specific requirements for the design of flexible printed boards and forms of component mounting and interconnecting structures. The flexible materials used in the structures are comprised of insulating films, reinforced and/or non-reinforced dielectric in combination with metallic materials. Revision D provides new design guidance and requirements for material selection and construction, selective (button) plating, minimum bending for flexible circuits with overlay, impedance and capacitance control, unsupported edge conductors/fingers and copper filled vias/microvias.

IPC-4101E: Covers the requirement for base materials that are referred to as laminate or prepreg and listed in the specification sheets that are contained in the last of the main body. These may be used primarily for rigid and multilayer printed boards for electronic interconnections. This document contains 65 individual specification sheets that can be searched using keywords. These keywords allow this document's user to find materials of a similar nature, but with specific differing properties that fine-tune their laminate and/or prepreg selection needs.

IPC-4204B: Establishes the classification system, the qualification and quality performance requirements for flexible metal-clad dielectric materials to be used for the fabrication of flexible printed boards. This standard encompasses 12 specification sheets that result from the combinations of various copper foil claddings; a polymer base dielectric selected from polyesters, polyimides, liquid crystal polymers and at least nine versions of polymer adhesives as well as adhesiveless bonding agents. The net result of these material combinations provide the industry with suitable clad, flexible dielectrics for fabricating flexible printed board interconnections. IPC-4204B also addresses how to utilize legacy designs that refer to earlier, out-of-date material designations.

IPC-6013D: Covers qualification and performance requirements for flexible printed boards designed to IPC-2221 and IPC-2223. The flexible printed board may be single-sided, double-sided, multilayer or rigid-flex multilayer. All of these constructions may include stiffeners, PTHs, microvias, and blind/buried vias. IPC-6013D incorporates new and updated requirements for final finishes, rigid-to-flex transition zones, deformation anomalies including wrinkles, creases and soda strawing, marking, registration (annular ring), conductor thickness reductions, dielectric removal in holes, resin smear, copper filled microvias and selective (button) hole plating In one aspect, the FPCB 10 for transmitting high frequency signals may be configured to minimize variations in impedance for discrete targets. Examples of impedance targets may include 50 ohms, 75 ohms, and/or 100 ohms. Selection of an impedance target may be based on attenuation, power and voltage requirements. In some embodiments, the FPCB 10 may be configured to maintain impedance values of 50 ohms +/−10%, 75 ohms +/−10%, and 100 ohms +/−10%.

In one aspect, the FPCB 10 for transmitting high frequency signals may be configured to maintain the electrical (phase) length of the flex cable to within a target of (+/−) 1 electrical degree across a range of frequencies (e.g., 67 to 300 MHz frequencies). The phase length or electrical length of a cable (flex, coax, etc.) may depend upon several factors including material composition and construction.

There are serval types of phase matching requirements and associated tolerances, typically utilized in the FPCB 10. Examples include:
  Relative Phase: Phase matched in sets—All the cable assemblies are matched to each other.
  Absolute Phase: Phase matched to an electrical length—As with a mechanical standard, this electrical length in degrees or time is determined by the customer.
  Phase matched to a standard: All of the cables are matched to a standard. This standard may have been established from a previous lot or provided by the customer.
  Phased offset matching: One or more cables are provided with a defined phase offset compared to each of the other cable assemblies.

In one aspect, the FPCB 10 may minimize the variations in velocity propagation to achieve a desired phase match. In one aspect, the FPCB 10 may be a delivery system that provides precision and control of phase length for parallel transmission lines while adhering to regulatory guidelines.

Figure 3A:
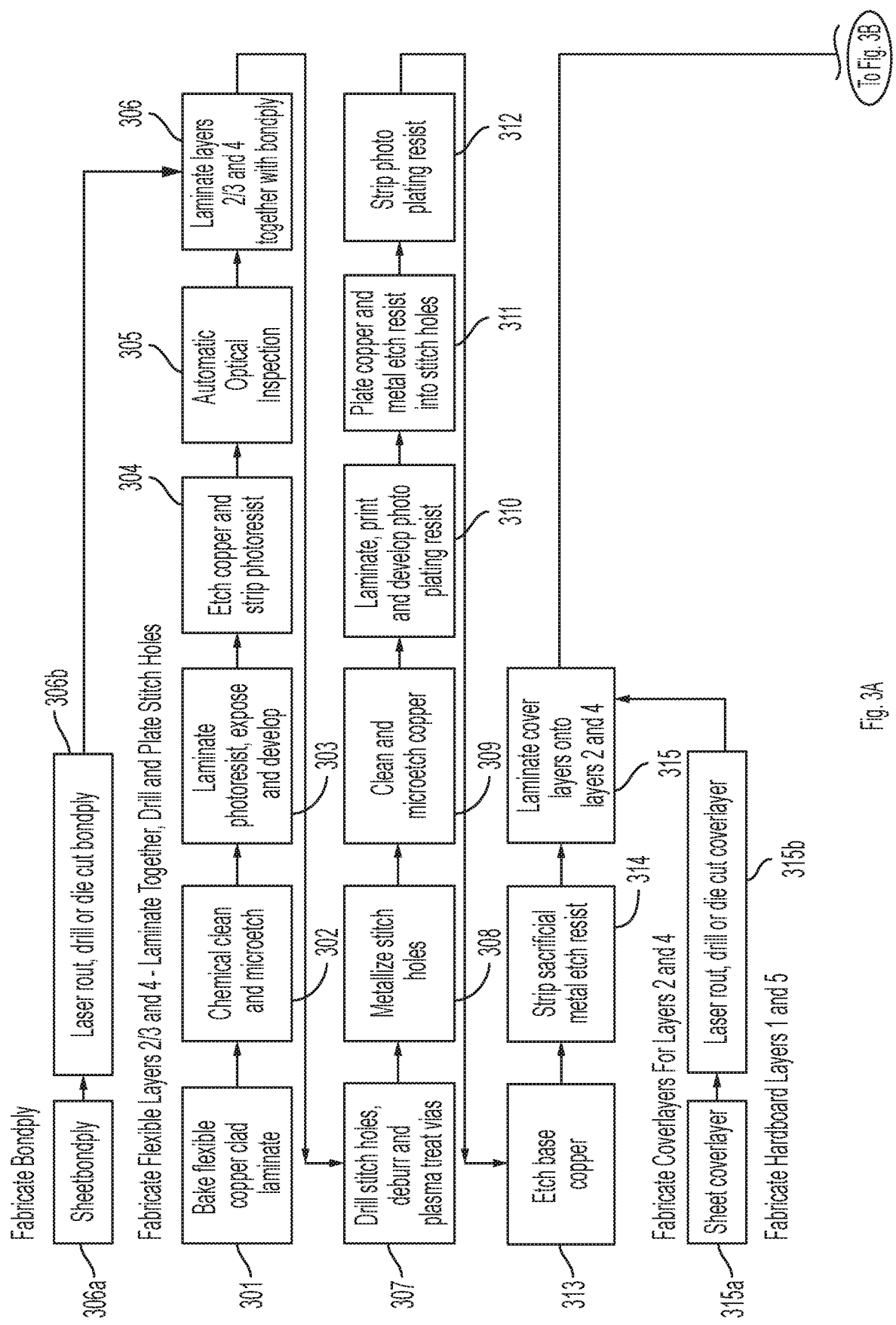
FIGS. 3A and 3B are flow charts of a method for manufacturing a flexible printed circuit board according to an exemplary embodiment of the invention.
Figure 3B:
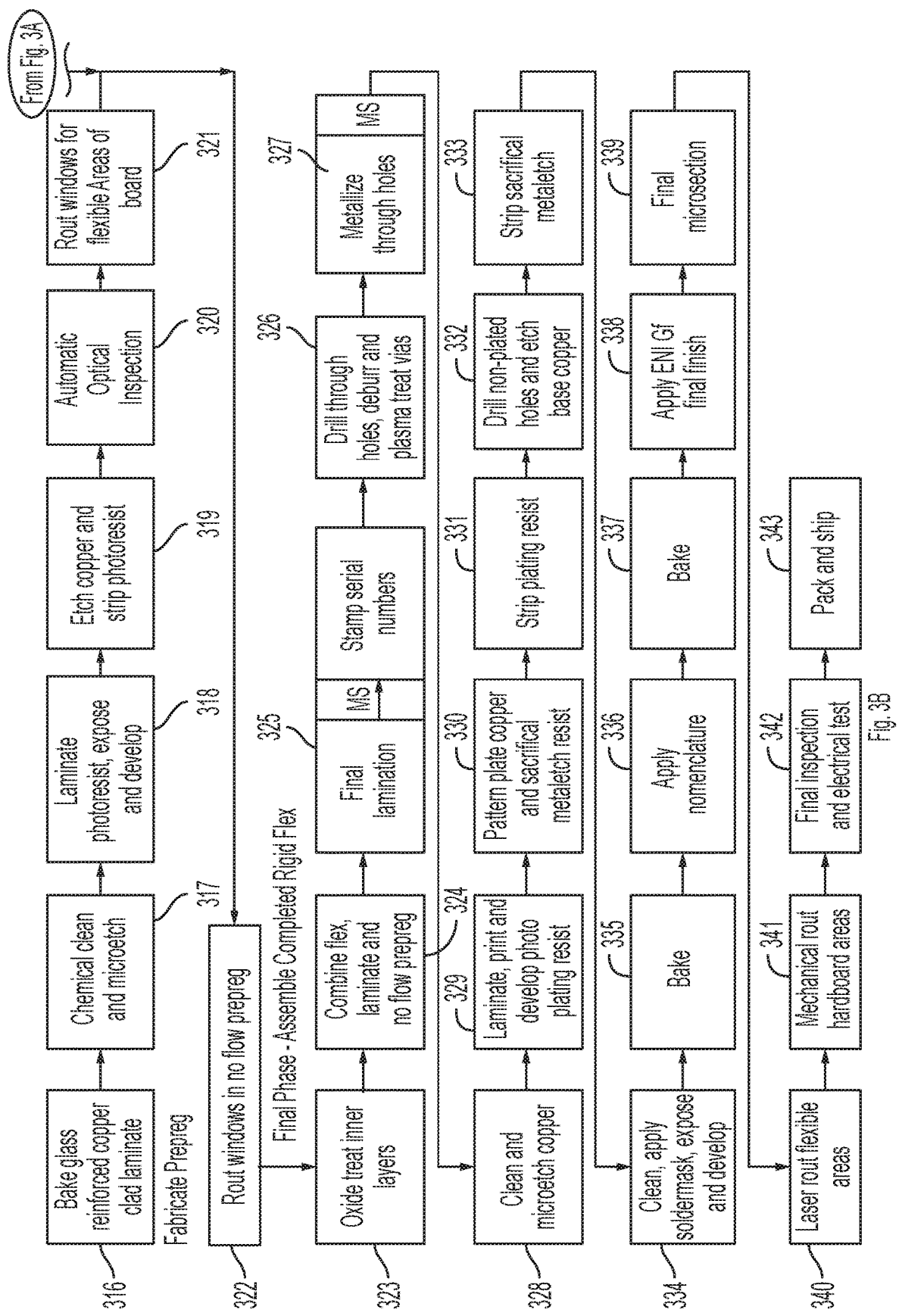

FIGS. 3A and 3B illustrate a method 30 for manufacturing a FPCB (e.g., FPCB 10) according to an exemplary embodiment of the invention.

In steps 301-315 flexible layers 2-4 may be laminated together and drilled. Via (e.g., stitching vias or shielding vias) holes may be plated.

In step 301, a flexible copper clad laminate (FCCL) may be baked. In some embodiments, the FCCL may be dielectric layer 101. In some embodiments the FCCL may be dielectric layer 106.

In step 302, the FCCL may be chemical cleaned and micro-etched.

In step 303, the FCCL may laminate photoresist, expose and develop.

In step 304, the FCCL may be etched and photoresist stripped.

In step 305, an automatic optical inspection may be performed.

In step 306, the bondply may be fabricated. Layers 2 and 4 may be laminated with bondply. In some embodiments, layer 2 may be dielectric layer 101 and layer 4 may be dielectric layer 105.

In step 306a, bondply may be fabricated by sheeting. In some embodiments, bondply may be top ground plane 102 or bottom ground plane 106.

In step 306b, bondply may be laser routed, drilled or die cut.

In step 307, vias may have holes that may be drilled, deburred and plasma treated.

In step 308, stitching holes may be metalized.

In step 309, vias may be cleaned and microetched.

In step 310 vias may be laminated, printed and photoplating resist may be developed.

In step 311, photoresist may be plated and metal etched into holes.

In step 312, photo plating resist may be stripped.

In step 313, base copper may be etched.

In step 314, sacrificial metal etch resist may be stripped.

In step 315, cover layers may be fabricated for layers 2 and 4. The cover layers may be laminated onto layers 2 and 4. In some embodiments, the cover layers may be cover layers 109-112.

In step 315a, cover layers 2 and 4 may be sheeted.

In step 315b, cover layers 2 and 4 may be laser routed, drilled and die cut.

In step 316-321, the hardboard layers 1 and 5 may be fabricated. In some embodiments hardboard layers 1 and 5 are top laminate layer 113 and bottom laminate layer 114, respectively.

In step 316, the hardboard layers 1 and 5 may be glass reinforced copper clad laminate that may be baked.

In step 317, the hardboard layers 1 and 5 may be chemical cleaned and microeteched.

In step 318, the photoresist may be laminated, exposed and developed.

In step 319, copper may be etched and photoresist may be stripped.

In step 320, automatic optical inspection of the hardboard layers 1 and 5 may be performed.

In step 321, the windows may be routed for flexible areas of FPCB.

In step 322, the prepreg layers may be fabricated by routing windows in no flow prepreg. In some embodiments, the prepreg layers are top prepreg layer 115 and bottom prepreg layer 116.

In steps 323-343, the rigid-flex printed circuit board may be assembled.

In step 323, the inner layers 2-4 may be oxidize treated. In some embodiments, inner layers are labeled as 101-112 in FIG. 1.

In step 324, the flexible layers, laminate and no flow prepreg may be combined. In some embodiments the flexible layers are layers 2-4. In some embodiments the laminate layers are top laminate 113 and bottom laminate 114. In some embodiments the prepreg layers are top prepreg layer 115 and bottom prepreg layer 116.

In step 325, a final lamination may be performed.

In step 326, through vias may be drilled, deburred and plasma treated. In some embodiments through vias are through vias 117-120.

In step 327, through via holes may be metallized.

In step 328, copper may be cleaned and microetched.

In step 329, photo plating resist may be laminated, printed and developed.

In step 330, copper and sacrificial metal etch resist may be pattern plated.

In step 331, resist may be strip plated.

In step 332, base copper may be drilled with non-plated holes and etched.

In step 333, copper and sacrificial metal etch resist may be stripped.

In step 334, through vias may be cleaned, solder mask applied, exposed and developed.

In step 335, the FPCB may be baked.

In step 336, nomenclature may be applied.

In step 337, the FPCB may be baked.

In step 338, a Electroless Nickel Immersion Gold (ENIG) finish applied to the FPCB.

In step 339, the FPCB may have final microsection performed.

In step 340, flexible areas may be laser routed.

In step 341, hardboard areas may be mechanical routed.

In step 342, the FPCB may undergo a final inspection and electrical test.

In step 343, the FPCB may be packed and ready for shipment.

Figure 4:
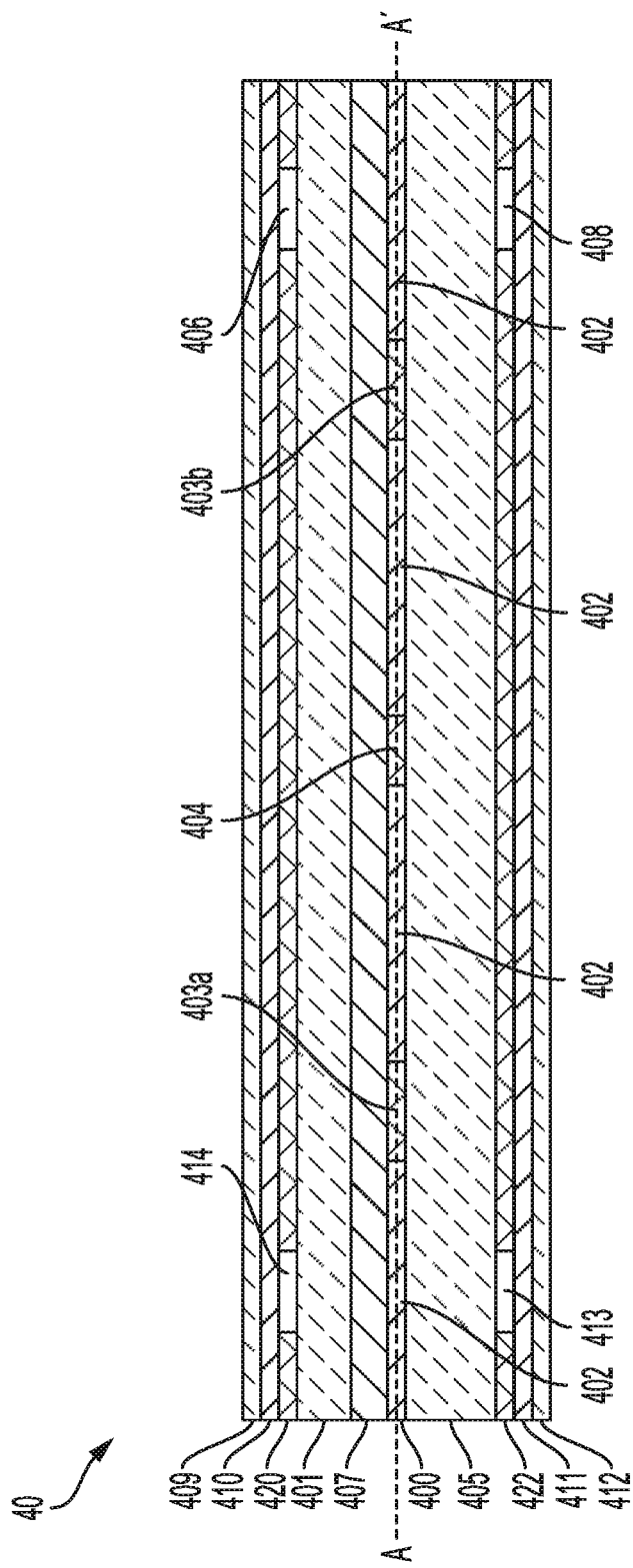
FIG. 4 is a partial cross-section of a flexible printed circuit board, according to an exemplary embodiment of the invention.

Referring now to FIG. 4, there is shown a cross-section of an FPCB 40, according to an exemplary embodiment of the invention.

In some embodiments, the FPCB 40 may forego including vias, such as vias 108a-b of FPCB 10 of FIG. 1. In these embodiments, ground traces of the FPCB 40 are sufficiently wide and a thickness of the dielectric layers are sufficiently thin to achieve EMI shielding. In some embodiments, the ground traces may be less than or equal to 0.045 inches. In some embodiments, one or more dielectric layers have a thickness of less than or equal to 0.001 inches.

The FPCB 40 may include a conductive layer 400. The conductive layer 400 may include a copper layer 402 with a width of 0.001 inches. The conductive layer 400 may include signal line 404, side ground plane 403a and/or side ground plane 403b. In some embodiments, the conductive layer 400 may include a plurality of signal lines and side ground planes, similar to signal line 404, side ground plane 403a and/or side ground plane 403b. The signal line 404 may be configured to transmit an electrical signal (e.g., an RF signal or a video signal). In some embodiments, the electrical signal may exceed 100 MHz. The signal line 404 may have a width of approximately 0.0039 inches. Side ground plane 403a and/or side ground plane 403b may have a width that is approximately 10 times the width of the signal line 404. In some embodiments, side ground plane 403a and/or side ground plane 403b may have a width of approximately 0.045 inches. Side ground plane 403a and/or side ground plane 403b may be positioned on opposite sides of the signal line 404 and may be configured as an electromagnetic shield to electrically isolate signal line 404 from external sources (e.g., other signal lines). A distance between the signal line 404 and the side ground plane 403a or the side ground plane 403b is approximately 0.0153 inches. A portion of the copper layer 402 may be disposed between the signal line 404 and the side ground plane 403a or the side ground plane 403b and may have a width of 0.0153 inches. Side ground plane 403a and side ground plane 403b may have a width of 0.0055 inches. Another portion of the copper layer 402 may be positioned outside of the side ground plane 403a or the side ground plane 403b and may have a width of approximately 0.0145 inches. The signal line 404, side ground plane 403a and/or side ground plane 403b may be approximately 0.001 inches thick.

The FPCB 40 may include a top dielectric layer 401 and a bottom dielectric layer 405. Top dielectric layer 401 and bottom dielectric layer 105 may be configured to electrically insulate signal line 404 from other ground planes prevent short circuiting of the signal line 404. Top dielectric layer 401 may have a width of 0.003 inches. Bottom dielectric layer 405 may have a width of 0.005 inches. Top dielectric layer 401 and/or bottom dielectric layer 405 may include a film layer. In another embodiment, top dielectric layer 401 may be approximately 0.004 inches thick. In another embodiment, bottom dielectric layer 405 may be approximately 0.003 inches thick. Top dielectric layer 401 and/or bottom dielectric layer 405 may be an adhesive. Top dielectric layer 401 and/or bottom dielectric layer 405 may be a flexible laminate.

The conductive layer 400 may be positioned between dielectric layer 401 and dielectric layer 405. The conductive layer 400 and top dielectric layer 401 may be connected using an acrylic adhesive 407. The acrylic adhesive 407 may be positioned between the conductive layer 400 and top dielectric layer 401 to adhere the conductive layer 400 to the dielectric layer 405. The acrylic adhesive 407 may be 0.002 inches thick.

The FPCB 40 may include a top copper layer 420 disposed above the dielectric layer 401. The copper layer 420 may include a top space 414 and/or top space 406. The FPCB 40 may include a bottom copper layer 422. The bottom copper layer 422 may include a bottom space 413 and/or bottom space 408. In some embodiments, top space 414, top space 406, bottom space 413 and/or bottom space 408 may each have a width of 0.0045 inches. The space or spacing may affect the electrical properties of the FPCB. The spacing and material may control impedance, capacitance, attenuation and other electrical properties of the FPCB 40. For example, by changing or adjusting the spacing, impedance, capacitance, attenuation and other electrical properties of the FPCB 40 may also change. Side ground plane 403a, side ground plane 403b, top copper layer 420, and/or bottom copper layer 422 may circumferentially surround signal line 404 to minimize electromagnetic interference between the signal line 404 and external sources.

The FPCB 40 may include top interior cover layer 410 and bottom interior cover layer 411. Top interior cover layer 410 and/or bottom interior cover layer 411 may be configured to cover top copper layer 420 and/or bottom copper layer 422, respectively. Top interior cover layer 410 and/or bottom interior cover layer 411 may be an acrylic adhesive. Top interior cover layer 410 and/or bottom interior cover layer 411 may be 0.001 inches thick.

The FPCB 10 may include top exterior cover layer 409 and bottom exterior cover layer 412. Top exterior cover layer 409 may be configured to cover top interior cover layer 410. Bottom exterior cover layer 412 may be configured to cover bottom interior cover layer 411. Top exterior cover layer 409 and/or bottom exterior cover layer 412 may be a polyimide film (e.g., a KAPTON film). Top exterior cover layer 409 and/or bottom exterior cover layer 412 may be 0.001 inches thick.

In some embodiments, an FPCB 40 may include 2, 4, 8, 16, 32, 64, and/or N signal lines, where N is an integer. In these embodiments, at least some portion of the FPCB 40 is repeated for each signal line and attached to the right or left side of the FPCB 40, separated by spaces (e.g., spaces 406, 408, 413, 414).

Figure 5:
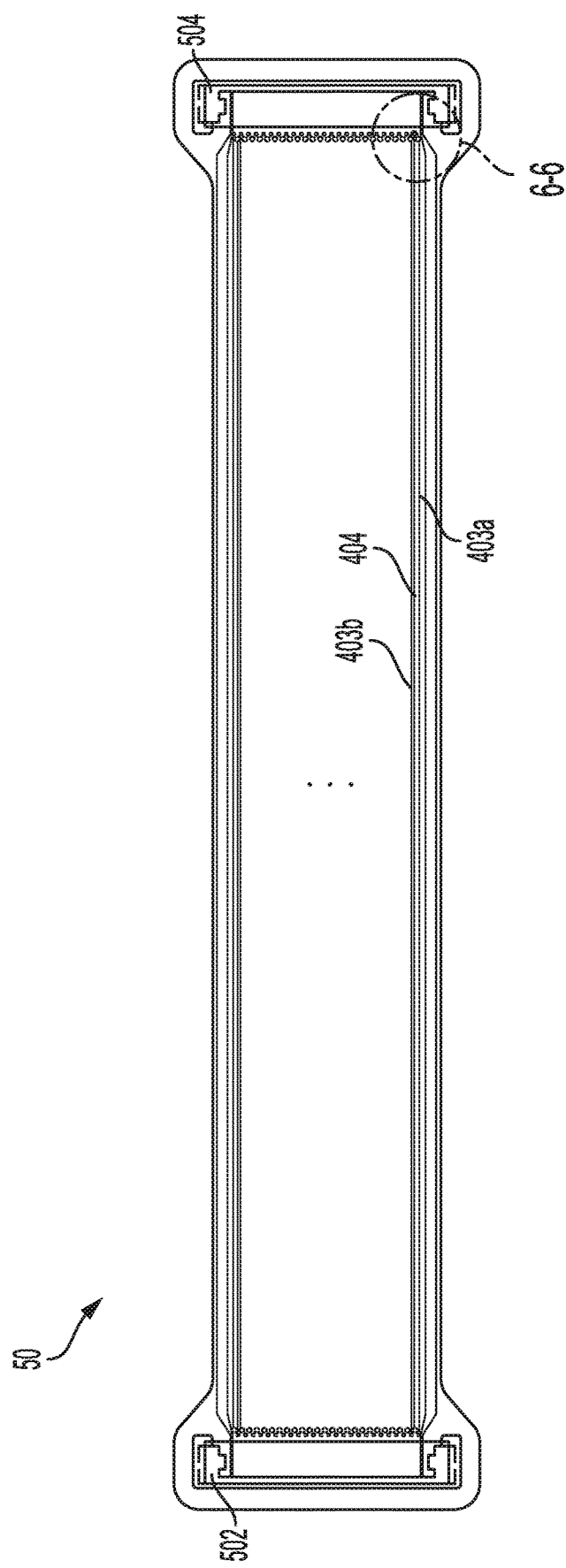
FIG. 5 is a conceptual top cross-section of a flexible printed circuit board, according to an exemplary embodiment of the invention.

Referring now to FIG. 5, there is shown a top cross-section of a cable 50 along A to A' of FIG. 4, according to an exemplary embodiment of the invention. While the cable 50 is illustrating the FPCB 40 of FIG. 4, the cable 50 may include other FPCBs, including FPCB 10 and FPCB 20. The cable 50 may include a first connector 502 and/or a second connector 504. The cable 50 may include one or more signals lines (e.g., signal line 404) and/or guard traces (e.g., ground traces 403a-b) that extend from the first connector 502 to the second connector 504. The first connector 502 and/or the second connector 504 may be a rigid printed circuit board. The first connector 502 and/or the second connector 504 may include one or more connector elements (e.g., pins, wires, contacts, zero insertion force connectors, etc.) that electrically couple the cable 50 to an external electrical device, such that when the first connector 502 and the second connector 504 is connected to first and second external devices, respectively, an electrical signal may pass through the cable 50 from the first external device to the second external device.

Each of the signal lines, and/or guard traces may be centered on, and perpendicular to, a connector pitch. As used herein, connector pitch may refer to the center line extending between at least two connector contacts (e.g., contacts 505a-b as shown in FIG. 6) of the connector (e.g., second connector 504).

In some embodiments, connector pitch, shielding and retention features may be based on system design and application. In some embodiments, a pitch of the one or more signal lines and a pitch of the one or more guard traces may be uniform. The pitch of the one or more signals lines and/or one or more guard traces are based on connector, impedance, dielectric strength and/or current carrying requirements of the application. In some embodiments, the cable 50 may include staggered vias to connect guard traces with top and bottom ground planes (as shown in FIGS. 1, 2 and 4). The guard traces are implemented as isolated ground planes on both top and bottom layers of the FPCB to separate each signal line, maintain electromagnetic communication between external devices and minimize crosstalk. In some embodiments, the cable 50 may include ground plane loops (e.g., loop 506 as shown in FIG. 6) to further isolate the signal lines (e.g., signal line 504) by surrounding the respective signal lines in a semi-circle or arc and thereby provide intra-contact cross talk shielding. In some embodiments, connector 502 and/or connector 504 may be coupled to one or more ground planes to shield the connector from electromagnetic interference.

In one embodiment, spacing between one or more shielding via 108a and shielding via 108b has been calculated to minimize ground effects while maximizing manufacturability. Shielding via stitching lengths may be less than or equal to $\frac{1}{4}$ wavelength; less than or equal to $\frac{1}{8}$ wavelength; or less than or equal to $\frac{1}{20}$ wavelength. In one embodiment, the wavelength is equal to approximately 60% of the free-space velocity for electromagnetic radiation propagating through the FPCB dielectrics (commonly measured and referred to as the velocity of propagation) divided by the application fundamental frequency.

In some embodiments, the cable 50 may include a signal line having a 50-ohm impedance. The signal line may have a width of 0.004 inches and a height of 0.005 inches (e.g., approximately 36 AWG). The cable 50 may include a layer of 0.5 oz. copper. The cable 50 may include a pitch of 0.5 mm.

When two signals are transmitted across the cable 50, due to variations in the materials, spacing, length width of traces due to manufacturing defects, the signals will be out of phase. To reduce the phase discrepancy, the variations in materials, spacing, length width of traces are minimized such that impedances between the signals are similar causing the electrical lengths to be similar such that the signals are within one electrical degree of each other. An electrical degree may refer to $\frac{1}{360}$th of a cycle of the signal traversing the signal lines. Electrical length may refer to the number of wavelengths of a signal required to traverse a signal line of a cable having a physical length.

As explained above, due to manufacturing process variation of the cable 50, the electrical lengths may be different for signal lines. In some embodiments, the physical length of the FPCB of the cable for at least one signal line may be adjusted (e.g., lengthened, or utilized with delay circuitry or equalization circuitry) so that electrical lengths for at least two signal lines on the cable 50 are substantially similar. For certain RF applications the two signal lines may be substantially similar if the two signal lines are at least one of: within several electrical degrees of each of the two signal lines. Adjusting the physical length of the FPCB to reduce variance in the electrical length between signal lines to within several electrical degrees is a more controlled manufacturing process with FPCB than coaxial cable.

Alternative Embodiments

In some embodiments, a flexible printed circuit board (e.g., FPCB 10) may comprise a conducting layer (e.g., conducting layer 100) which may include a first signal line (e.g., signal line 104), a first ground plane (e.g., ground plane 103a) and a second ground plane (e.g., ground plane 103b). A first ground plane layer (e.g., ground plane layer 120) may include a third ground plane (e.g., ground plane 102). A second ground plane layer (e.g., ground plane layer 122) may include a fourth ground plane (e.g., ground plane 106). A first shielding via (e.g., shielding via 108a) may extend from the third ground plane to the fourth ground plane through the first ground plane to electrically connect the first ground plane, the third ground plane and the fourth ground plane. A second shielding via (e.g., shielding via 108b) may extend from the third ground plane to the fourth ground plane through the second ground plane to electrically connect the second ground plane, the third ground plane and the fourth ground plane. The first ground plane, the second ground plane, the third ground plane, the fourth ground plane, the first shielding via and the second shielding via, together, may circumferentially surround the first signal line to minimize electromagnetic interference with the first signal line.

In some embodiments, the signal may be positioned between the first ground plane and the second ground plane. In some embodiments, the first signal line may be positioned between the third ground plane and the fourth ground plane. In some embodiments, the signal line may be positioned between the first shielding via and the second shielding via.

In some embodiments, the impedance of the first signal line may be between 47.5 ohms and 52.5 ohms. In some embodiments, the impedance of the first signal line may be between 49 ohms and 51 ohms. In other embodiments, the impedance of the first signal line may be between 45 to 55 ohms, with a targeted center of the distribution at 50 ohms. In one aspect, the impedance of the first signal line is between 67.5 ohms and 82.5 ohms. In one aspect, the impedance of the first signal line is approximately 75 ohms. In one aspect, the impedance of the first signal line is between 90 ohms and 110 ohms. In one aspect, the impedance of the first signal line is approximately 100 ohms. By using an FPCB with certain materials used for each layer, and by using photolithography, tighter geometries such as trace width variance, trace height variance and trace spacing variance can be achieved, which minimize variance in impedance and result in better signal quality as compared to coaxial cable.

In some embodiments, the flexible printed circuit board further comprises a first dielectric plane (e.g., dielectric plane 101) positioned between the signal line and the third ground plane. In some embodiments, the first dielectric plane has a thickness of about 0.004 inches. In some embodiments, the flexible printed circuit board further comprises: a second dielectric plane (e.g., dielectric plane 105) positioned between the signal line and the fourth ground plane. In some embodiments, the second dielectric plane has a thickness of about 0.003 inches. In some embodiments, a total thickness of the conducting layer, the first ground plane layer, the second ground plane layer, the first dielectric plane and the second dielectric plane is approximately 0.0094 inches. In some embodiments, the first ground plane, the second ground plane, and the first signal line have a thickness of about 0.001 inches. In some embodiments, the third ground plane may have a thickness of about 0.007 inches. In some embodiments, the fourth ground plane may have a thickness of about 0.007 inches.

In some embodiments, the flexible printed circuit board may include a second signal line (e.g., signal line 204), a fifth ground plane (e.g., ground plane 203a) and a sixth ground plane (e.g., ground plane 203b) at the conducting layer (e.g., conducting layer 100), the second signal line being separate and distinct from the first signal line. The flexible printed circuit board may include a seventh ground plane (e.g. ground plane 202) at the first ground plane layer. The flexible printed circuit board of may include an eighth ground plane (e.g., ground plane 206) at the second ground plane layer. The flexible printed circuit board of may include a third shielding via (e.g., shielding via 208a) extending from the seventh ground plane to the eighth ground plane and extending through the fifth ground plane to electrically connect the fifth ground plane, the seventh ground plane and the eighth ground plane. The flexible printed circuit board may include a fourth shielding via (e.g., shielding via 208b) extending from the seventh ground plane to the eighth ground plane and extending through the sixth ground plane to electrically connect the sixth ground plane, the seventh ground plane and the eighth ground plane. In some embodiments, the fifth ground plane, the sixth ground plane, the seventh ground plane, the eighth ground plane, the second shielding via and the third shielding via, together, circumferentially surrounding the second signal line to minimize electromagnetic interference with the second signal line.

In some embodiments, the second shielding via and the third shielding via are positioned between the first signal line and the second signal line. In some embodiments, the second ground plane and the fifth ground plane are positioned between the first signal line and the second signal line. In some embodiments, the flexible printed circuit board, further comprises a dielectric plane (e.g., dielectric plane 210) positioned between the third ground plane and the seventh ground plane at the first ground plane layer to electromagnetically isolate the third ground plane and the seventh ground plane. In some embodiments, the flexible printed circuit board, further comprises a dielectric plane (e.g., dielectric plane 212) positioned between the second ground plane and the fifth ground plane at the conducting layer to electromagnetically isolate the second ground plane and the fifth ground plane. In some embodiments, the flexible printed circuit board, further comprises a dielectric plane (e.g., dielectric plane 214) positioned between the fourth ground plane and the eighth ground plane at the second ground plane layer to electromagnetically isolate the fourth ground plane and the eighth ground plane.

In some embodiments, a method for manufacturing a flexible printed circuit board (e.g., FPCB 10), comprises: providing a conducting layer (e.g., conducting layer 100) including a first signal line (e.g., signal line 104), a first ground plane (e.g., side ground plane 103a) and a second ground plane (e.g., side ground plane 103b). The method may comprise providing a first ground plane layer (e.g., ground plane layer 120) including a third ground plane (e.g., top ground plane 102). The method may comprise providing a second ground plane layer (e.g., bottom ground plane layer 122) including a fourth ground plane (e.g., bottom ground plane 106). The method may comprise stitching a first shielding via (e.g., shielding via 108a) extending from the third ground plane to the fourth ground plane and extending through the first ground plane to electrically connect the first ground plane, the third ground plane and the fourth ground plane. The method may comprise stitching a second shielding via (e.g., shielding via 108b) extending from the third ground plane to the fourth ground plane and extending through the second ground plane to electrically connect the second ground plane, the third ground plane and the fourth ground plane. The first ground plane, the second ground plane, the third ground plane, the fourth ground plane, the first shielding via and the second shielding via, together, may circumferentially surround the first signal line to minimize electromagnetic interference with the first signal line.

It will be appreciated by those skilled in the art that changes could be made to the exemplary embodiments shown and described above without departing from the broad inventive concept thereof. It is understood, therefore, that this invention is not limited to the exemplary embodiments shown and described, but it is intended to cover modifications within the spirit and scope of the present invention as defined by the claims. For example, specific features of the exemplary embodiments may or may not be part of the claimed invention and features of the disclosed embodiments may be combined. Unless specifically set forth herein, the terms "a", "an" and "the" are not limited to one element but instead should be read as meaning "at least one". As used herein, the term "about" or "approximately"

may refer to + or −10% of the value referenced. For example, "about 9" is understood to encompass 8.2 and 9.9.

It is to be understood that at least some of the figures and descriptions of the invention have been simplified to focus on elements that are relevant for a clear understanding of the invention, while eliminating, for purposes of clarity, other elements that those of ordinary skill in the art will appreciate may also comprise a portion of the invention. However, because such elements are well known in the art, and because they do not necessarily facilitate a better understanding of the invention, a description of such elements is not provided herein.

Further, to the extent that the method does not rely on the particular order of steps set forth herein, the particular order of the steps should not be construed as limitation on the claims. The claims directed to the method of the present invention should not be limited to the performance of their steps in the order written, and one skilled in the art can readily appreciate that the steps may be varied and still remain within the spirit and scope of the present invention.

I claim:

1. A flexible printed circuit board, comprising:
   a conducting layer including a first signal line, a first ground plane, a second ground plane, a contact positioned at an end of the first signal line, and an isolation loop forming an arc in the conducting layer and surrounding the end of the first signal line proximate to the contact;
   a first ground plane layer including a third ground plane;
   a second ground plane layer including a fourth ground plane; and
   a first shielding via extending from the third ground plane to the fourth ground plane and extending through the first ground plane to electrically connect the first ground plane, the third ground plane and the fourth ground plane;
   a second shielding via extending from the third ground plane to the fourth ground plane and extending through the second ground plane to electrically connect the second ground plane, the third ground plane and the fourth ground plane; and
   a stitching via extending from the third ground plane to the fourth ground plane to electrically connect the third ground plane and the fourth ground plane;
   wherein the first ground plane, the second ground plane, the third ground plane, the fourth ground plane, the first shielding via, the second shielding via and the isolation loop, together, circumferentially surround the first signal line to minimize electromagnetic interference between the first signal line and a second signal line located within the flexible printed circuit board, that is separate and distinct from the first signal line.

2. The flexible printed circuit board of claim 1, wherein the first signal line is positioned between the first ground plane and the second ground plane.

3. The flexible printed circuit board of claim 1, wherein the first signal line is positioned between the third ground plane and the fourth ground plane.

4. The flexible printed circuit board of claim 1, wherein the first signal line is positioned between the first shielding via and the second shielding via.

5. The flexible printed circuit board of claim 1, wherein an impedance of the first signal line is between 45 ohms and 55 ohms.

6. The flexible printed circuit board of claim 1, wherein an impedance of the first signal line is between approximately 49 ohms and approximately 51 ohms.

7. The flexible printed circuit board of claim 1, further comprising:
   a first dielectric plane positioned between the first signal line and the third ground plane.

8. The flexible printed circuit board of claim 1, further comprising:
   a second dielectric plane positioned between the first signal line and the fourth ground plane.

9. The flexible printed circuit board of claim 1, further comprising:
   a fifth ground plane and a sixth ground plane at the conducting layer,
   a seventh ground plane at the first ground plane layer;
   an eighth ground plane at the second ground plane layer;
   a third shielding via extending from the seventh ground plane to the eighth ground plane and extending through the fifth ground plane to electrically connect the fifth ground plane, the seventh ground plane and the eighth ground plane; and
   a fourth shielding via extending from the seventh ground plane to the eighth ground plane and extending through the sixth ground plane to electrically connect the sixth ground plane, the seventh ground plane and the eighth ground plane,
   the fifth ground plane, the sixth ground plane, the seventh ground plane, the eighth ground plane, the second shielding via and the third shielding via, together, circumferentially surrounding the second signal line to minimize electromagnetic interference with the second signal line.

10. The flexible printed circuit board of claim 9, wherein the second shielding via and the third shielding via are positioned between the first signal line and the second signal line.

11. The flexible printed circuit board of claim 9, wherein the second ground plane and the fifth ground plane are positioned between the first signal line and the second signal line.

12. The flexible printed circuit board of claim 9, further comprising a dielectric plane positioned between the third ground plane and the seventh ground plane at the first ground plane layer to electromagnetically isolate the third ground plane and the seventh ground plane.

13. The flexible printed circuit board of claim 9, further comprising a dielectric plane positioned between the second ground plane and the fifth ground plane at the conducting layer to electromagnetically isolate the second ground plane and the fifth ground plane.

14. The flexible printed circuit board of claim 9, further comprising a dielectric plane positioned between the fourth ground plane and the eighth ground plane at the second ground plane layer to electromagnetically isolate the fourth ground plane and the eighth ground plane.

15. The flexible printed circuit board of claim 1, wherein the stitching via extends from the third ground plane to the fourth ground plane without extending through the first ground plane or the second ground plane.

16. A method for manufacturing a flexible printed circuit board, comprising:
   providing a conducting layer including a first signal line, a first ground plane a second ground plane, a contact positioned at an end of the first signal line, and an isolation loop forming an arc in the conducting layer and surrounding the end of the first signal line proximate to the contact;
   providing a first ground plane layer including a third ground plane;

providing a second ground plane layer including a fourth ground plane; and stitching a first shielding via extending from the third ground plane to the fourth ground plane and extending through the first ground plane to electrically connect the first ground plane, the third ground plane and the fourth ground plane;

stitching a second shielding via extending from the third ground plane to the fourth ground plane and extending through the second ground plane to electrically connect the second ground plane, the third ground plane and the fourth ground plane;

stitching a stitching via extending from the third ground plane to the fourth ground plane to electrically connect the third ground plane and the fourth ground plane;

wherein the first ground plane, the second ground plane, the third ground plane, the fourth ground plane, the first shielding via and the second shielding via and the isolation loop, together, circumferentially surround the first signal line to minimize electromagnetic interference between the first signal line and a second signal line located within the flexible printed circuit board, that is separate and distinct from the first signal line.

17. The method for manufacturing a flexible printed circuit board of claim 16, further comprising:

positioning the first signal line between the first ground plane and the second ground plane.

18. The method for manufacturing a flexible printed circuit board of claim 16, further comprising:

positioning the first signal line between the third ground plane and the fourth ground plane.

19. The method for manufacturing a flexible printed circuit board of claim 16, further comprising:

providing the first signal line between the first shielding via and the second shielding via.

20. The method for manufacturing a flexible printed circuit board of claim 16, wherein an impedance of the first signal line is between 45 ohms and 55 ohms.

21. The method for manufacturing a flexible printed circuit board of claim 16, wherein an impedance of the first signal line is between approximately 49 ohms and approximately 51 ohms.

22. The method for manufacturing a flexible printed circuit board of claim 16, further comprising:

providing a first dielectric plane between the first signal line and the third ground plane.

23. The method for manufacturing a flexible printed circuit board of claim 16, further comprising:

providing a second dielectric plane positioned between the first signal line and the fourth ground plane.

24. The method for manufacturing a flexible printed circuit board of claim 15, further comprising:

providing, a fifth ground plane and a sixth ground plane at the conducting layer,;

providing a seventh ground plane at the first ground plane layer;

providing an eighth ground plane at the second ground plane layer;

stitching a third shielding via extending from the seventh ground plane to the eighth ground plane and extending through the fifth ground plane to electrically connect the fifth ground plane, the seventh ground plane and the eighth ground plane; and stitching a fourth shielding via extending from the seventh ground plane to the eighth ground plane and extending through the sixth ground plane to electrically connect the sixth ground plane, the seventh ground plane and the eighth ground plane, the fifth ground plane, the sixth ground plane, the seventh ground plane, the eighth ground plane, the second shielding via and the third shielding via, together, circumferentially surrounding the second signal line to minimize electromagnetic interference with the second signal line.

25. The method for manufacturing a flexible printed circuit board of claim 24, further comprising:

positioning the second shielding via and the third shielding via between the first signal line and the second signal line.

26. The method for manufacturing a flexible printed circuit board of claim 24, further comprising:

positioning the second ground plane and the fifth ground plane between the first signal line and the second signal line.

27. The method for manufacturing a flexible printed circuit board of claim 24, further comprising:

positioning a dielectric plane between the third ground plane and the seventh ground plane at the first ground plane layer to electromagnetically isolate the third ground plane and the seventh ground plane.

28. The method for manufacturing a flexible printed circuit board of claim 24, further comprising:

positioning a dielectric plane between the second ground plane and the fifth ground plane at the conducting layer to electromagnetically isolate the second ground plane and the fifth ground plane.

29. The method for manufacturing a flexible printed circuit board of claim 24, further comprising:

positioning a dielectric plane between the fourth ground plane and the eighth ground plane at the second ground plane layer to electromagnetically isolate the fourth ground plane and the eighth ground plane.

* * * * *